United States Patent
Chen et al.

(10) Patent No.: US 10,090,844 B2
(45) Date of Patent: Oct. 2, 2018

(54) CLOCK AND DATA RECOVERY MODULE

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Yen-Chung Chen, Hsinchu (TW); Wen-Juh Kang, Hsinchu (TW); Yi-Lin Lee, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

(\*) Notice: Subject to any disclaimer, the term of this patent is extended or adjusted under 35 U.S.C. 154(b) by 0 days.

(21) Appl. No.: 15/618,143

(22) Filed: Jun. 9, 2017

(65) Prior Publication Data
US 2018/0069554 A1    Mar. 8, 2018

(30) Foreign Application Priority Data
Sep. 5, 2016 (CN) .......................... 2016 1 0800886

(51) Int. Cl.
*H04L 7/00* (2006.01)
*H03L 7/08* (2006.01)
*H04B 1/7073* (2011.01)
*H04L 7/033* (2006.01)
*H04B 15/02* (2006.01)

(52) U.S. Cl.
CPC .......... *H03L 7/0807* (2013.01); *H04B 1/7073* (2013.01); *H04B 15/02* (2013.01);
(Continued)

(58) Field of Classification Search
CPC .. H03D 1/04; H03D 3/24; H03K 3/00; H03K 5/13; H03K 5/19; H03L 7/06; H03L 7/08;
(Continued)

(56) References Cited

U.S. PATENT DOCUMENTS 8,687,738 B1 \* 4/2014 Lee .................... H04L 7/033
327/141
9,065,601 B1 \* 6/2015 Jenkins ................ H04L 7/0337
(Continued)

FOREIGN PATENT DOCUMENTS

TW    I463804 B    12/2014

*Primary Examiner* — Shawkat M Ali
(74) *Attorney, Agent, or Firm* — CKC & Partners Co., Ltd.

(57) ABSTRACT

A clock and data recovery module includes a clock and data recovery loop and a spread spectrum clock tracking circuit. The clock and data recovery loop includes a clock and data recovery unit and a first phase interpolator. The first phase interpolator is coupled to the clock and data recovery unit and configured to generate a data clock signal and an edge clock signal according to a phase signal and a reference clock signal. The clock and data recovery unit is configured to generate the phase signal according to a data signal, the data clock signal and the edge clock signal. The spread spectrum clock tracking circuit is configured to generate the reference clock signal according to the data signal, and to transmit the reference clock signal to the first phase interpolator. The spread spectrum clock tracking circuit is decoupled to the clock and data recovery loop.

10 Claims, 3 Drawing Sheets

(52) U.S. Cl.
CPC .......... *H04L 7/0025* (2013.01); *H04L 7/0087* (2013.01); *H04L 7/033* (2013.01); *H04L 7/0331* (2013.01); *H04B 2201/7073* (2013.01)

(58) Field of Classification Search
CPC .......... H03L 7/0807; H03L 7/91; H04B 1/10; H04B 1/7073; H04L 7/00; H04L 7/04; H04L 7/06; H04L 7/033; H04L 7/0012; H04L 7/0016; H04L 7/0025; H04L 7/0079; H04L 7/0087; H04L 7/0331; H04L 25/00; H04L 27/22
USPC ...... 327/3, 20, 158, 233, 237, 355; 370/503, 370/516; 375/149, 224, 226, 228, 340, 375/346, 350, 355, 371, 373, 375, 376
See application file for complete search history.

(56) References Cited

U.S. PATENT DOCUMENTS

| | | | |
|---|---|---|---|
| 9,209,962 B1* | 12/2015 | Mishra .................. | H03K 5/135 |
| 9,231,752 B1* | 1/2016 | Yan ....................... | H04L 7/0016 |
| 2006/0083343 A1* | 4/2006 | Roederer ............... | H04L 7/033 |
| | | | 375/375 |
| 2007/0047683 A1* | 3/2007 | Okamura ............. | H03L 7/0814 |
| | | | 375/355 |
| 2007/0146014 A1* | 6/2007 | Cheung ................. | H03L 7/081 |
| | | | 327/20 |
| 2013/0216014 A1* | 8/2013 | Kong ....................... | H03L 7/07 |
| | | | 375/376 |
| 2016/0013929 A1* | 1/2016 | Takanashi ............... | H03L 7/07 |
| | | | 375/375 |

\* cited by examiner

CLOCK AND DATA RECOVERY MODULE

RELATED APPLICATIONS

This application claims priority to Chinese Application Serial Number 201610800886.7, filed Sep. 5, 2016, which is herein incorporated by reference.

BACKGROUND

Field of Invention

The present disclosure relates to a signal processing circuit. More particularly, the present disclosure relates to a clock and data recovery module.

Description of Related Art

With the rapid development of signal transmission technology, requirements of signal jitter tolerance for a receiver have become more and more stringent. To accommodate signal jitter tolerance standards becoming more stringent, a clock and data recovery (CDR) circuit is commonly disposed in a receiver to recover data signals affected by signal jitters accordingly.

However, in addition to signal jitter generated when data signals are transmitted, operation of the clock and data recovery circuit may also generate signal jitter of the data signals. To decrease signal jitter generated from the clock and data recovery circuit, a common manner is to increase a phase interpolation resolution of a phase interpolator (PI) in a phase tracking circuit, but this manner deviates from a manner that a lower phase interpolation is necessary for operation of a phase interpolator in a frequency tracking circuit operates.

Accordingly, a significant challenge is related to ways in which to remain the operation of the clock and data recovery circuit while at the same time decreasing the overall signal jitter associated with designing clock and data recovery modules.

SUMMARY

An aspect of the present disclosure is directed to a clock and data recovery module. The clock and data recovery module includes a clock and data recovery loop and a spread spectrum clock tracking circuit. The clock and data recovery loop includes a clock and data recovery unit and a first phase interpolator. The clock and data recovery unit is configured to generate a phase signal according to a data signal. The first phase interpolator is coupled to the clock and data recovery unit, and configured to generate a data clock signal and an edge clock signal according to the phase signal and a reference clock signal. The clock and data recovery unit is further configured to generate the phase signal according to the data signal, the data clock signal and the edge clock signal. The spread spectrum clock tracking circuit is configured to generate the reference clock signal according to the data signal, and to transmit the reference clock signal to the first phase interpolator. The spread spectrum clock tracking circuit is decoupled to the clock and data recovery loop.

It is to be understood that the foregoing general description and the following detailed description are by examples, and are intended to provide further explanation of the invention as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
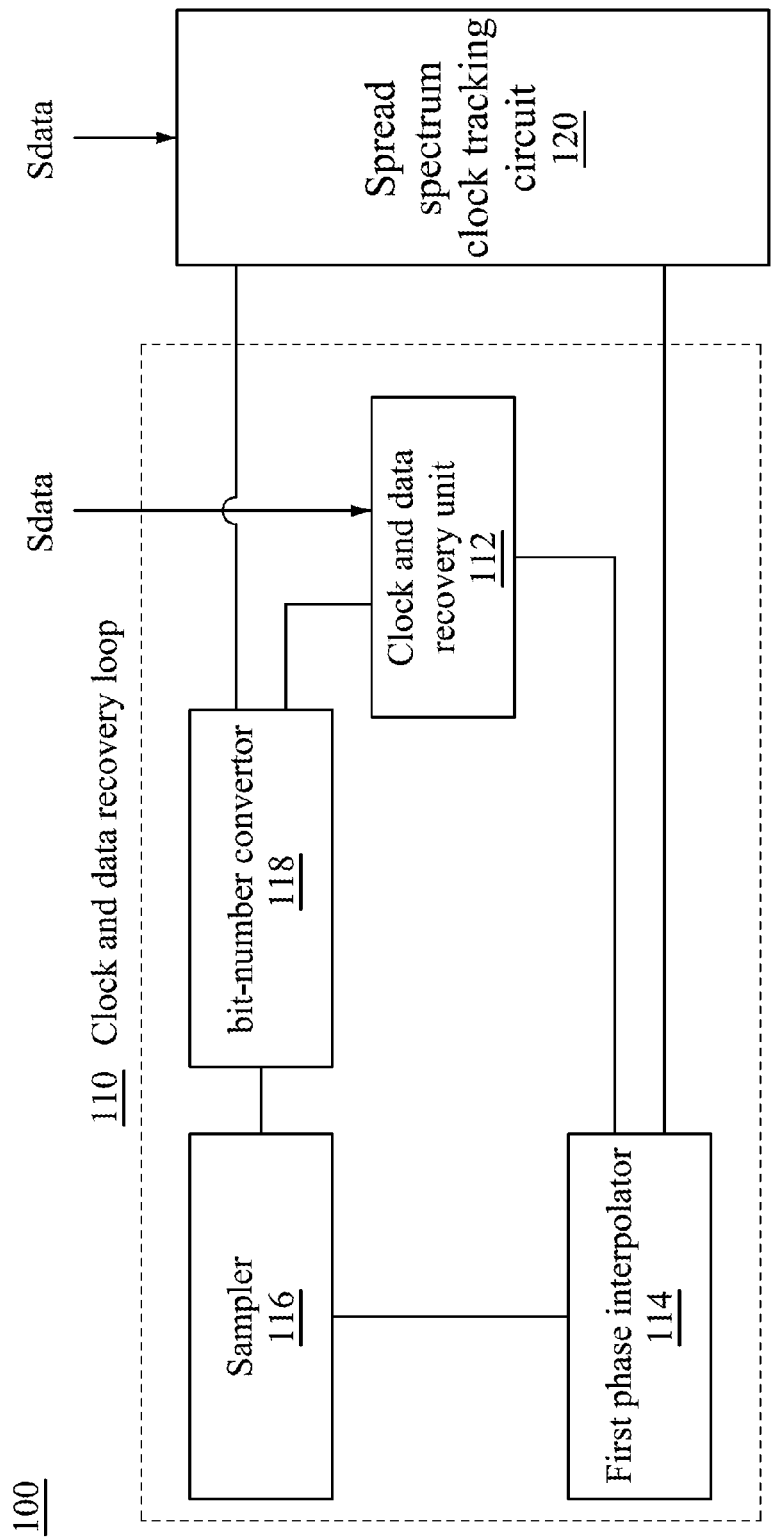
FIG. 1 is a block diagram of a clock and data recovery module according to embodiments of the present disclosure.

FIG. 1 is a block diagram of a clock and data recovery module according to embodiments of the present disclosure. As shown in FIG. 1, the clock and data recovery module 100 includes a clock and data recovery loop 110 and a spread spectrum clock tracking circuit 120. The clock and data recovery loop 110 includes a clock and data recovery unit 112 and a first phase interpolator 114, and the clock and data recovery unit 112 is coupled to the first phase interpolator 114. Additionally, the clock and data recovery loop 110 is decoupled to the spread spectrum clock tracking circuit 120. For example, the spread spectrum clock tracking circuit 120 is used as a circuit which can operate independently, but not used as an element or a circuit in the clock and data recovery loop 110.

The clock and data recovery unit 112 is configured to receive a data signal Sdata, and to generate a phase signal according to the data signal Sdata, then to transmit the phase signal to the first phase interpolator 114. The spread spectrum clock tracking circuit 120 is configured to receive the data signal Sdata, and to generate a reference clock signal according to the data signal Sdata, then to transmit the reference clock signal to the first phase interpolator 114. The first phase interpolator 114 is configured to generate a data clock signal and an edge clock signal according to the phase signal from the clock and data recovery unit 112 and the reference clock signal from the spread spectrum clock tracking circuit 120.

Subsequently, the clock and data recovery unit 112 is further configured to generate the phase signal according to the data signal Sdata, the data clock signal and the edge clock signal. For example, the data clock signal and the edge clock signal generated from the first phase interpolator 114 can be transmitted back to the clock and data recovery unit 112 directly or by further signal processing, and the phase signal is regenerated from the clock and data recovery unit 112.

In one embodiment, the clock and data recovery loop 110 further includes a sampler 116, and the sampler 116 is coupled to the first phase interpolator 114. The sampler 116 is configured to receive the data clock signal and the edge clock signal generated from the first phase interpolator 114, and to sample the data clock signal and the edge clock signal to generate a data sample signal and an edge sample signal.

In another embodiment, the clock and data recovery loop 110 further includes a bit-number converter 118, and the bit-number converter 118 is coupled to the sampler 116. The bit-number converter 118 is configured to receive the data sample signal and the edge sample signal generated from the sampler 116, and to convert bit number for the data sample signal and the edge sample signal. Subsequently, the bit-number converter 118 transmits the converted data sample signal and the converted edge sample signal to the clock and data recovery unit 112, and the phase signal is regenerated from the clock and data recovery unit 112. Accordingly, the clock and data recovery unit 112, the first phase interpolator 114, the sampler 116 and the bit-number converter 118 form a first loop circuit, so that the clock and data recovery unit 112 can iteratively operate according to the received data signal Sdata, the converted data sample signal and the converted edge sample signal. For example, the bit-number converter 118 converts the bit number for the data sample signal and the edge sample signal according to a signal form which can be supported by the clock and data recovery unit 112.

In further embodiment, the data sample signal and the edge sample signal generated from the sampler 116 are represented by binary-bit signal streams, and the bit-number converter 118 converts the binary-bit signal streams of the data sample signal and the edge sample signal to quaternion-bit signal streams. After the bit-number converter 118 converts the signal streams of the data sample signal and the edge sample signal to the quaternion-bit signal streams, the converted data sample signal and the converted edge sample signal are transmitted to the clock and data recovery unit 112, and the phase signal is regenerated from the clock and data recovery unit 112. It should be noted that, the specific implementation of the bit-number converter 118 mentioned above is merely used for illustration, and the present invention is not limited thereto.

In one embodiment, the spread spectrum clock tracking circuit 120 is further configured to adjust a frequency of the reference clock signal to make a frequency of the reference clock be closed to a frequency corresponding to the data signal Sdata, so as to decrease jitters of the reference clock signal. In another embodiment, the spread spectrum clock tracking circuit 120 generates several reference clock signals according to the data signal Sdata, and the reference clock signals have the same frequency, but have different phases.

In one embodiment, the first phase interpolator 114 is configured to execute phase interpolation for the reference clock signals generated from the spread spectrum clock tracking circuit 120 according to the phase signal, so as to generate the data clock signal and the edge clock signal. For example, when the first phase interpolator 114 executes the phase interpolation for the reference clock signals, the first phase interpolator 114 can select two reference clock signals from the reference clock signals, and generate the data clock signal and the edge clock signal according to the two selected reference clock signals. For example, phases of the data clock signal and the edge clock signal are located between phases of the two reference clock signals selected by the first phase interpolator 114.

Additionally, operation of the first phase interpolator 114 relates to a phase interpolation resolution. For example, when a unit interval of the phase interpolation resolution becomes small, differences among the data clock signal and the edge clock signal generated from the first phase interpolator 114 and a clock signal corresponding to the data signal Sdata can be decreased, but operational time being necessary for the first phase interpolator 114 to generate the data clock signal and the edge clock signal may be correspondingly increased. On the contrary, the differences among the data clock signal and the edge clock signal generated from the first phase interpolator 114 and the clock signal corresponding to the data signal Sdata may be increased, but the operational time for the first phase interpolator 114 to generate the data clock signal and the edge clock signal can be correspondingly decreased.

Furthermore, dither jitters or hunting jitters generated by processing the data signal Sdata via the clock and data recovery unit 112 for processing the data signal Sdata can be further decreased by increasing the unit interval of the phase interpolation resolution of the first phase interpolator 114. In one embodiment, the unit interval of the phase interpolation resolution can be in the range of $1/32$ to $1/128$. It should be noted that, the specific implementation of the phase interpolation resolution is merely used for illustration, and the present invention is not limited thereto.

In one embodiment, the clock and data recovery unit 112 represents a second-order clock and data recovery unit, an operation clock frequency of the clock and data recovery unit 112 relates to a data rate corresponding to the data signal Sdata. For example, the clock and data recovery module 100 can be applied to a device which supports the DisplayPort (such as, the DisplayPort 1.3). When the data rate corresponding to the data signal Sdata of the DisplayPort 1.3 is equal to 8.1 Gbps, the operation clock frequency of the clock and data recovery unit 112 can be equal to a frequency corresponding to a quarter value of the data rate (is approximately equal to 2 GHz). It should be noted that, the specific implementation of the operation clock frequency of the clock and data recovery unit 112 is merely used for illustration, and the present invention is not limited thereto.

In one embodiment, the spread spectrum clock tracking circuit 120 is respectively coupled to the first phase interpolator 114 and the bit-number converter 118 of the clock and data recovery loop 110. The bit-number converter 118 is configured to transmit the converted data sample signal and the converted edge sample signal to the spread spectrum clock tracking circuit 120, and a frequency signal is regenerated from the spread spectrum clock tracking circuit 120. Accordingly, the spread spectrum clock tracking circuit 120, the first phase interpolator 114, the sampler 116 and the bit-number converter 118 of the clock and data recovery loop 110 form a second loop circuit, so that the spread spectrum clock tracking circuit 120 can iteratively operate according to the received data signal Sdata, the converted data sample signal and the converted edge sample signal.

Figure 2:
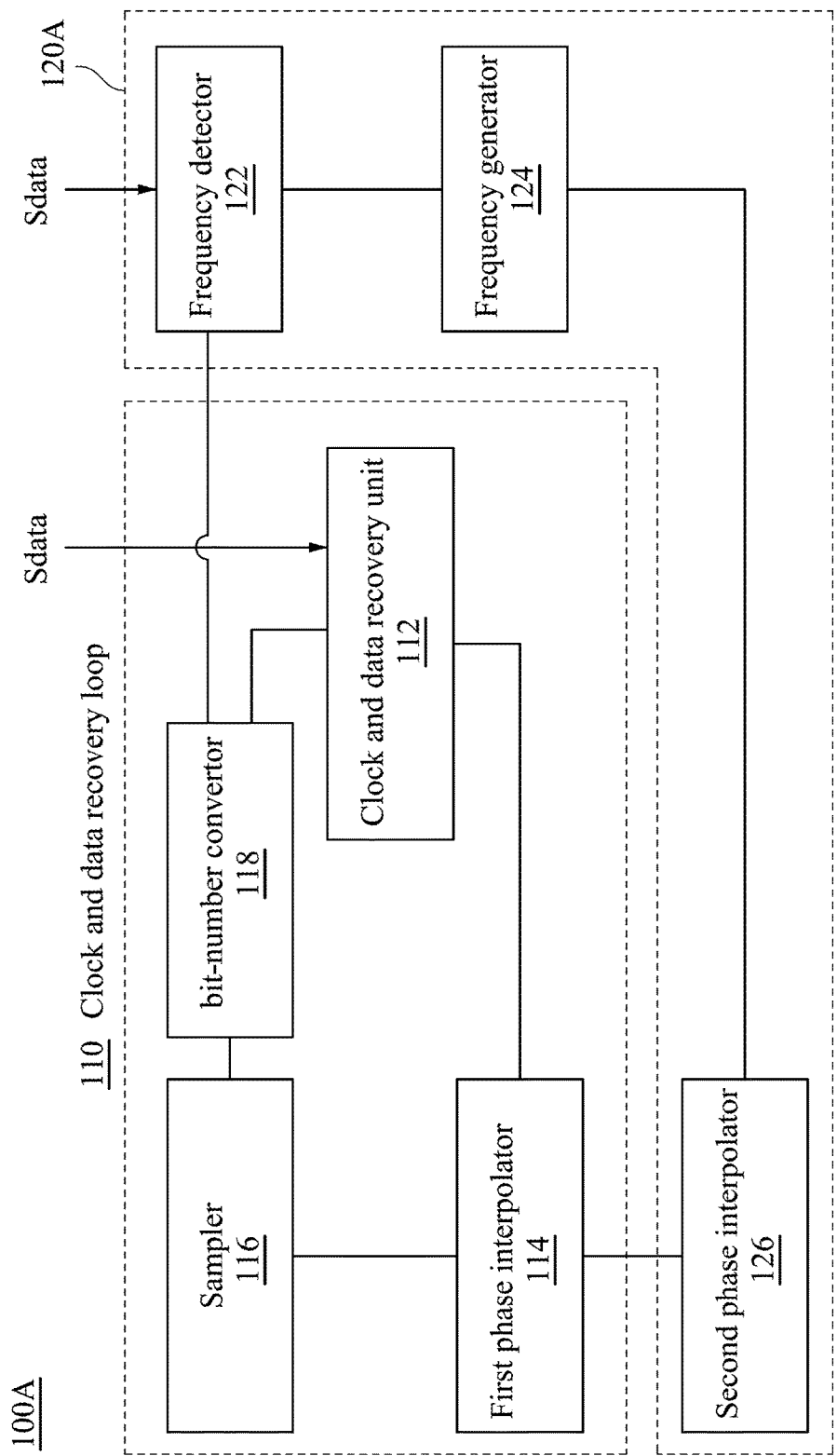
FIG. 2 is a block diagram of a clock and data recovery module according to one embodiment of the present disclosure.

FIG. 2 is a block diagram of a clock and data recovery module according to one embodiment of the present disclosure. In one embodiment, the clock and data recovery module 100 as shown in FIG. 1 can be implemented by a clock and data recovery module 100A as shown in FIG. 2, but the present invention is not limited thereto.

With respect to FIG. 1, FIG. 2 depicts one of the manners of implementing the spread spectrum clock tracking circuit 120 as shown in FIG. 1 in detail, such as the spread spectrum clock tracking circuit 120A. The spread spectrum clock tracking circuit 120A includes a frequency detector 122, a frequency generator 124 and a second phase interpolator 126. The frequency detector 122 is coupled to the frequency generator 124, and the frequency generator 124 is further coupled to the second phase interpolator 126. Additionally, the clock and data recovery loop 110 is decoupled to the spread spectrum clock tracking circuit 120A. For example, the spread spectrum clock tracking circuit 120A is used as a circuit which can operate independently, but not used as an element or a circuit in the clock and data recovery loop 110. The function and the configuration of the clock and data recovery unit 112, the first phase interpolator 114, the sampler 116 and the bit-number converter 118 of the clock and data recovery loop 110 are illustrated by the previous embodiments in detail, so this will be not repeated.

The frequency detector 122 is configured to detect a frequency of the data signal Sdata to generate a frequency detection signal, and to transmit the frequency detection signal to the frequency generator 124. The frequency generator 124 is configured to generate the frequency signal according to the frequency detection signal from the frequency detector 122, and to transmit the frequency signal to the second phase interpolator 126. The second phase interpolator 126 is configured to generate the reference clock signal according to the frequency signal from the frequency generator 124, and to transmit the reference clock signal to the first phase interpolator 114 of the clock and data recovery loop 110.

In one embodiment, the second phase interpolator 126 is further configured to adjust the frequency of the reference clock signal, so as to make the frequency of the reference clock be closed to the clock frequency corresponding to the data signal Sdata, so as to decrease the jitters of the reference clock signal. In one embodiment, the second phase interpolator 126 generates several reference clock signals according to the frequency signal generated from frequency generator 124, and the reference clock signals have the same frequency, but have different phases.

Additionally, operation of the second phase interpolator 126 relates to a phase interpolation resolution. However, a phase interpolation resolution applied to the second phase interpolator 126 is contrary to a higher phase interpolation resolution which is necessary for the first phase interpolator 114, so as to reduce dither jitters or hunting jitters generated from the clock and data recovery unit 112. For example, the operation of the second phase interpolator 126 in the spread spectrum clock tracking circuit 120A is commonly used to support a faster phase rotation or a higher phase update rate. Accordingly, a lower phase interpolation resolution is implemented in the second phase interpolator 126 to achieve the requirements mentioned above. In one embodiment, a unit interval of the phase interpolation resolution applied to the second phase interpolator 126 can be in the range of $1/32$ to $1/128$. It should be noted that, the specific implementation of the phase interpolation resolution mentioned above is merely used for illustration, and the present disclosure is not limited thereto.

In one embodiment, the second phase interpolator 126 is coupled to the first phase interpolator 114 in the clock and data recovery loop 110, and the frequency detector 122 is coupled to the bit-number converter 118 of the clock and data recovery loop 110. The bit-number converter 118 is configured to transmit the converted data sample signal and the converted edge sample signal to the frequency detector 122, and the frequency detection signal is regenerated from the frequency detector 122. Accordingly, the frequency detector 122, the frequency generator 124 and the second phase interpolator 126 of the spread spectrum clock tracking circuit 120A, the first phase interpolator 114, the sampler 116 and the bit-number converter 118 of the clock and data recovery loop 110 form the second loop circuit, so that the frequency detector 122 can iteratively operate according to the received data signal Sdata, the converted data sample signal and the converted edge sample signal.

Figure 3:
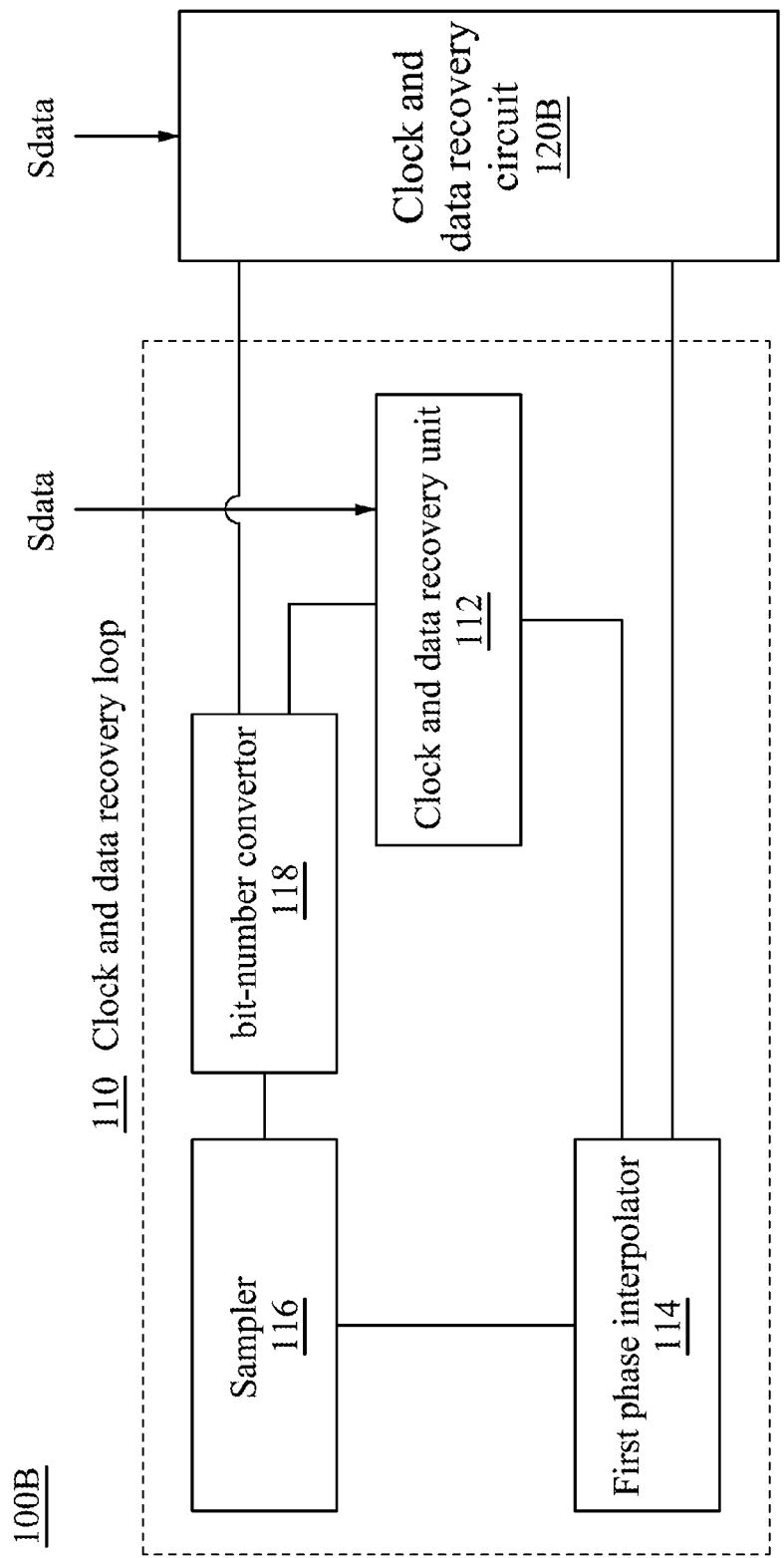
FIG. 3 is a block diagram of a clock and data recovery module according to another embodiment of the present disclosure.

FIG. 3 is a block diagram of a clock and data recovery module according to another embodiment of the present disclosure. In one embodiment, the clock and data recovery module 100 as shown in FIG. 1 can be implemented by a clock and data recovery module 100B as shown in FIG. 3, but the present invention is not limited thereto.

With respect to FIG. 1, FIG. 3 depicts one of the manners of implementing the spread spectrum clock tracking circuit 120 as shown in FIG. 1 in detail, such as a clock and data recovery circuit 120B. In one embodiment, the clock and data recovery circuit 120B is configured to receive the data signal Sdata, and to generate the frequency signal according to the data signal Sdata. Then, the clock and data recovery circuit 120B is configured to generate the reference clock signal according to the frequency signal, and to transmit the reference clock signal to the first phase interpolator 114 of the clock and data recovery loop 110. It should be noted that, the specific implementation of the clock and data recovery circuit 120B mentioned above is merely used for illustration, and the present disclosure is not limited thereto. Additionally, the function and the configuration of the clock and data recovery unit 112, the first phase interpolator 114, the sampler 116 and the bit-number converter 118 of the clock and data recovery loop 110 are illustrated by the previous embodiments in detail, so this will not be repeated.

In one embodiment, the clock and data recovery unit 112 and a second clock and data recovery unit are second-order clock and data recovery units, and operation clock frequencies of the clock and data recovery unit 112 and the second clock and data recovery unit relate to a data rate corresponding to the data signal Sdata. For example, the clock and data recovery module 100A can be applied to a device which supports the DisplayPort 1.3. When a data rate corresponding to the data signal Sdata of the DisplayPort 1.3 is equal to 8.1 Gbps, the operation clock frequencies of the clock and data recovery unit 112 and the second clock and data recovery unit can be equal to frequencies corresponding to a quarter value of the data rate (are approximately equal to 2 GHz). It should be noted that, the specific implementation of the operation clock frequencies of the clock and data recovery unit 112 and the second clock and data recovery unit mentioned above is used for illustration, and the present disclosure is not limited thereto.

In the embodiments mentioned above, the present invention decouples the clock and data recovery loop and the spread spectrum clock tracking circuit of the clock and data recovery module, so that the clock and data recovery loop and the spread spectrum clock tracking circuit respectively execute phase tracking and frequency tracking. Then, the present invention integrates the result of the phase tracking and the frequency tracking to recovery the data signal. With the technology of the present invention, different phase interpolation resolutions can be respectively implemented by the clock and data recovery loop and the spread spectrum clock circuit which are decoupled to each other to make them achieve global optimums of the phase interpolation resolutions, so as to enhance accuracy and efficiency of the phase tracking and the frequency tracking and make the data signal recovered by the clock and data recovery module achieve the requirements of the signal jitter tolerance of the DisplayPort (such as, the DisplayPort 1.3).

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present invention cover modifications and variations of this present disclosure provided they fall within the scope of the following claims.

What is claimed is:

1. A clock and data recovery module, comprising:
a clock and data recovery loop, comprising:
a clock and data recovery unit, configured to generate a phase signal according to a data signal; and
a first phase interpolator, coupled to the clock and data recovery unit, and configured to generate a data clock signal and an edge clock signal according to the phase signal and a reference clock signal,
wherein the clock and data recovery unit is further configured to generate the phase signal according to the data signal, the data clock signal and the edge clock signal; and
a spread spectrum clock tracking circuit, configured to generate the reference clock signal according to the data signal, and to transmit the reference clock signal to the first phase interpolator, wherein the spread spectrum clock tracking circuit is decoupled to the clock and data recovery loop.

2. The clock and data recovery module of claim 1, wherein the clock and data recovery loop further comprises:
a sampler, coupled to the first phase interpolator, and configured to sample the data clock signal and the edge clock signal to generate a data sample signal and an edge sample signal.

3. The clock and data recovery module of claim 2, wherein the clock and data recovery loop further comprises:
a bit-number converter, coupled to the sampler, and configured to convert bit number for the data sample signal and the edge sample signal, and to transmit the converted data sample signal and the converted edge sample signal to the clock and data recovery unit.

4. The clock and data recovery module of claim 3, wherein the data sample signal and the edge sample signal comprise binary-bit signal streams, and the bit-number converter is configured to convert the binary-bit signal streams to quaternion-bit signal streams.

5. The clock and data recovery module of claim 4, wherein the spread spectrum clock tracking circuit comprises:

a frequency detector, configured to detect a frequency of the data signal to generate a frequency detection signal; and
a frequency generator, coupled to the frequency detector, and configured to generate a frequency signal according to the frequency detection signal.

6. The clock and data recovery module of claim 5, wherein the spread spectrum clock tracking circuit further comprises:
a second phase interpolator, coupled to the frequency generator, and configured to generate the reference clock signal according to the frequency signal, and to transmit the reference clock signal to the first phase interpolator.

7. The clock and data recovery module of claim 6, wherein the frequency detector is coupled to the bit-number converter, the bit-number converter converts the bit number for the data sample signal and the edge sample signal, and transmits the converted data sample signal and the converted edge sample signal to the frequency detector.

8. The clock and data recovery module of claim 7, wherein the data sample signal and the edge sample signal comprise binary-bit signal streams, and the bit-number converter is configured to convert the binary-bit signal streams to quaternion-bit signal streams.

9. The clock and data recovery module of claim 1, wherein the spread spectrum clock tracking circuit comprises a clock and data recovery circuit, and the clock and data recovery circuit is configured to generate the reference clock signal according to the data signal.

10. The clock and data recovery module of claim 9, wherein the clock and data recovery circuit comprises:
a second clock and data recovery unit, configured to generate a frequency signal according to the data signal; and
a second phase interpolator, coupled to the second clock and data recovery unit, and configured to generate the reference clock signal according to the frequency signal, and to transmit the reference clock signal to the first phase interpolator.

* * * * *